United States Patent
Elliott

(10) Patent No.: US 7,620,864 B2
(45) Date of Patent: Nov. 17, 2009

(54) METHOD AND APPARATUS FOR CONTROLLING ACCESS TO AND/OR EXIT FROM A PORTION OF SCAN CHAIN

(75) Inventor: John Robert Elliott, Payson, AZ (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 11/553,122

(22) Filed: Oct. 26, 2006

(65) Prior Publication Data

US 2008/0104464 A1  May 1, 2008

(51) Int. Cl.
*G01R 31/28* (2006.01)
(52) U.S. Cl. .................. 714/726; 714/727; 714/729
(58) Field of Classification Search .......... 714/726, 714/727, 729
See application file for complete search history.

(56) References Cited

U.S. PATENT DOCUMENTS

| | | | |
|---|---|---|---|
| 5,357,572 A * | 10/1994 | Bianco et al. ............ | 713/193 |
| 5,497,378 A | 3/1996 | Amini et al. | |
| 6,615,380 B1 * | 9/2003 | Kapur et al. ............ | 714/738 |
| 7,047,468 B2 | 5/2006 | Belluomini et al. | |
| 7,085,978 B2 * | 8/2006 | McLaurin et al. ............ | 714/726 |
| 7,308,631 B2 * | 12/2007 | McLaurin ............ | 714/726 |
| 7,398,441 B1 * | 7/2008 | Gee ............ | 714/727 |
| 7,539,915 B1 * | 5/2009 | Solt ............ | 714/726 |

FOREIGN PATENT DOCUMENTS

EP  001439398 A1 *  7/2004

* cited by examiner

*Primary Examiner*—John J Tabone, Jr.
(74) *Attorney, Agent, or Firm*—Matthew C. Zebrer; Roy W. Truelson

(57) ABSTRACT

The present invention provides a method, apparatus and program product for providing controlled access to and/or exit from a portion of a scan chain. The method, apparatus, and program product take advantage of a first controlling device placed within the scan chain prior to the portion of the scan chain to be controlled, a second controlling device placed within the scan chain just after the portion of the scan chain to be controlled, and an access control mechanism coupled to the first controlling device and the second controlling device, wherein the access control mechanism controls access to and/or exit from the portion of the scan chain between the first controlling device and the second controlling device. The access control mechanism selectively allows access to and/or exit from the protected portion upon receipt from an instruction from a routine, wherein the routine is only accessible to an authorized user.

19 Claims, 10 Drawing Sheets

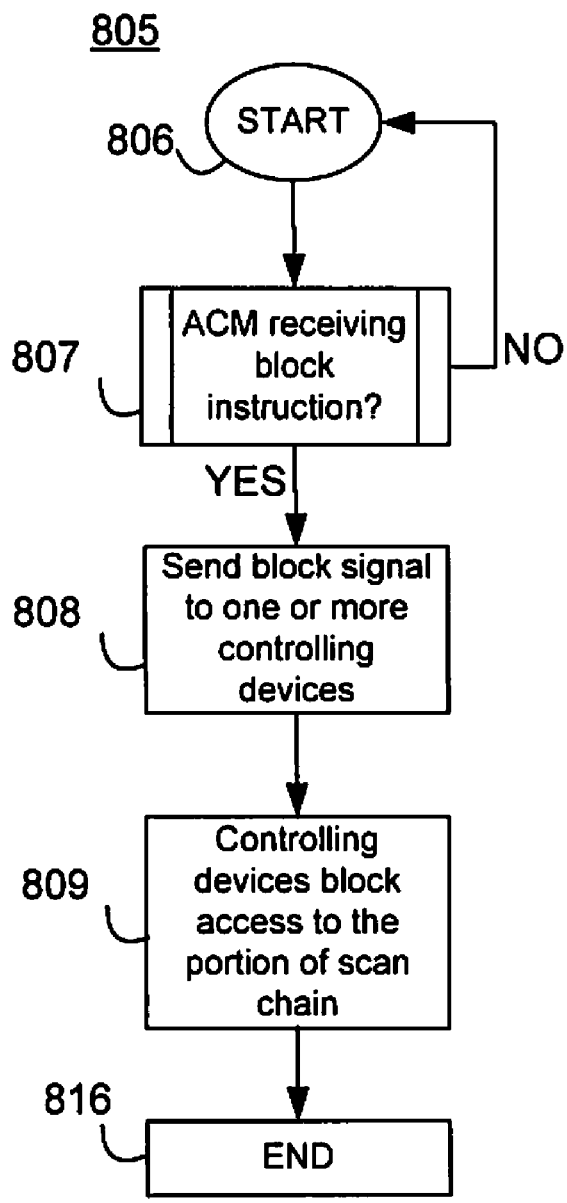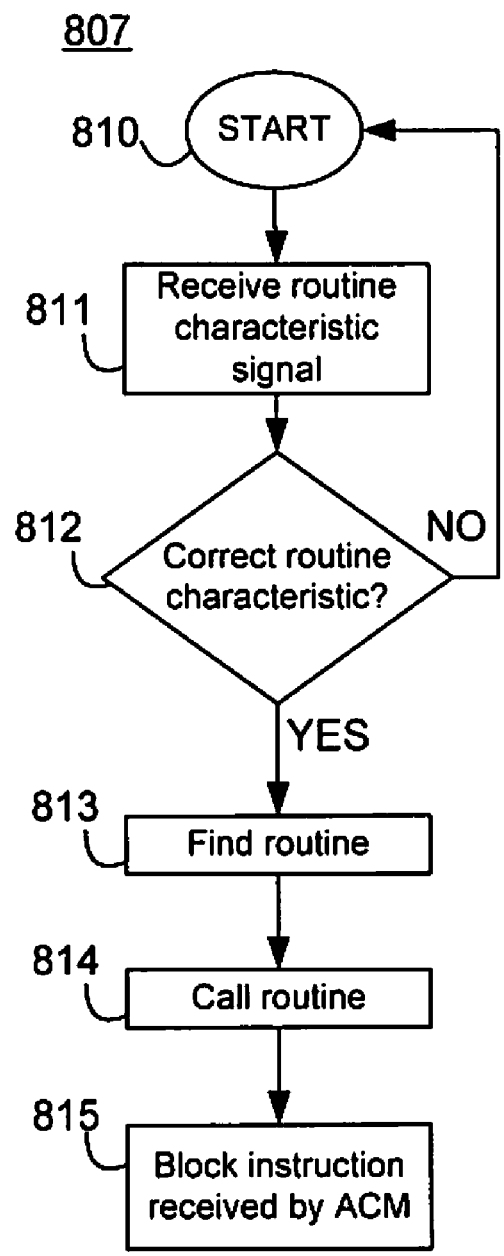
FIG. 10A
FIG. 10B

METHOD AND APPARATUS FOR CONTROLLING ACCESS TO AND/OR EXIT FROM A PORTION OF SCAN CHAIN

FIELD OF THE INVENTION

The present invention relates generally to integrated circuits (IC's), and more specifically, to an apparatus, method, and computer program product for preventing unauthorized access to and/or exit from proprietary information contained in IC devices after the device has left the manufacturing facility.

BACKGROUND OF THE INVENTION

As integrated circuits (IC's) and printed circuit boards (PCB's) have become smaller, more complex and more powerful, testing such components has become increasingly difficult. Such high density devices create several unique manufacturing challenges: such as the accessibility of test points within the designs and the high cost of test equipment.

In the mid-1980's a group of European companies formed a group called Joint European Test Action Group (JETAG) to address the issues of accessibility of test points within the designs and the high cost of test equipment. The JETAG group proposed incorporating hardware into standard components (controlled by software), thus eliminating the need for sophisticated in-circuit test equipment. In 1988, the concept gained momentum in North America and several companies formed the Joint Test Access Group (JTAG) consortium to formalize the idea. In 1990, the Institute of Electrical and Electronic Engineers (IEEE) refine the concept and created the 1149.1 standard known as IEEE Standard Test Access Port and Boundary Scan Architecture.

The specification JTAG devised uses boundary scan technology, which enables engineers to perform extensive debugging and diagnostics on a system through a number of dedicated test pins. Signals are scanned into and out of registers connected to the I/O pins of a device serially to control its inputs and test the outputs under various conditions. By themselves, the I/O pins provide limited visibility into the workings of the device. However in scannable devices, the registers are connected in a dedicated path around the device's boundary. The path creates a virtual access capability that circumvents the normal inputs and provides direct control of the device and detailed visibility at its outputs. Today, boundary scan technology is the most popular and widely used design for test technique in the industry.

During testing, I/O signals enter and leave the chip through the boundary scan registers. The boundary scan registers can be configured to support external testing for interconnection between chips or internal testing for logic within the chip. To provide boundary scan capability, IC vendors add additional logic to each of their devices, including multiple other register types, a dedicated scan path connecting these other registers, four or five additional pins, and control circuitry. The overhead for this additional logic and generally well worth the price to have efficient testing capabilities.

Boundary scan control signals, collectively referred to as the Test Access Port (TAP), define a serial protocol for scan based devices. The first of these signals, TCK/clock synchronizes the internal state machine operations. The second signal, TMS/mode select is sampled at the rising edge of TCK to determine the next state. The third signal, TDI/data-in is sampled at the rising edge of TCK and is shifted into the device's test or programming logic when the internal state machine is in the correct state. The fourth signal, TDO/data-out represents the data shifted out of the device's test or programming logic and is valid on the falling edge of TCK when the internal state machine is in the correct state. Finally, the TRST/reset (optional) signal, when driven low, resets the internal state machine. In addition to the TAP, a boundary scan chain also contains the following devices: a TAP Controller, an instruction register, at least one scannable test data register, and multiple boundary scan registers.

The TCK, TMS and TRST input pins drive a 16-state TAP controller state machine. The TAP controller manages the exchange of data and instructions. The controller advances to the next state based on the value of the TMS signal at each rising edge of TCK. With the proper wiring, multiple IC's/boards can be tested simultaneously. An external file, known as a Boundary Scan Description Language (BDSL) file, defines the capabilities of any single device's boundary-scan logic.

In normal operation, the instruction register receives an instruction through TDI, decodes it, and selects the appropriate data register depending on the state of the TAP controller. The instruction register is used to set the mode of operation for one or more data registers, and is controlled by the TAP signals, and can be placed between TDI and TDO for loading and unloading serially shifted data. In addition to the instruction register, numerous other registers including a data register, bypass register, device identity register, and multiple user defined registers can be utilized. The particular register of operation is dictated by an instruction from the instruction register.

Boundary scan cells operate in four different functional modes: normal mode, capture mode, scan mode and update mode. Each mode state is governed by a mode signal. In normal mode the boundary scan cell is transparent and the data in value corresponds to the data out value. During normal IC activity, data in and data out pass freely through each boundary scan cell. In capture mode, data in moves through the boundary scan cell and is stored, and thereby applies a clock pulse signal on Clock IR. The data out value depends on the mode. In scan mode, the boundary scan cells are connected in series to form a chain through the scan in and scan out signals. The shift operations are controlled by the Clock IR signal. In update mode, the value stored in that was previously loaded by a scan or capture operation, is latched into a update flip flop with a Clock IR pulse. Once latched the signal is available to pass through the chain and ultimately becomes the data out value.

The TAP controller is a 16 state finite state machine added to the IC die itself and recognizes communication protocol and generates internal control signals used by the remainder of the boundary scan chain. The TAP Controller is driven by TCK, TMS, and optionally TRST only. These signals program the TAP controller, generating clock and control signals for the instruction and test data registers. Only three events can trigger a change of TAP controller state: a TCK rising edge, assertion of a logic 0 onto TRST (if it exists), and system power on. Movement trough the TAP controller is controlled by the value of TMS, a set up time prior to the rising edge of TCK. The 1s and 0s adjacent to each state transition arc show the value that must be present on TMS at the time of the next rising edge of TCK. An assertion of TRST will always send TAP controller to a reset state.

The standard test process or verifying a device or circuit board using boundary-scan technology is as follows: First, the test applies test or diagnostic data in the input pins of the device. Next, the boundary scan cells capture the data in the Boundary Scan Systems monitoring the input pins. Data is then scanned out of the device via the TDO pin, for verification. Data can then be scanned into the device via the TDI pin. Finally the tester can then verify data on the output pins of the device.

Scan tests can find manufacturing defects such as unconnected pins, a missing device, an incorrect or rotated device on a circuit board, and even a failed or dead device. One advantage of scan testing technology is the ability to observe data at the device inputs and control the data at the outputs independently of the application logic. Another benefit of scan testing it that one is able to view and/or access internal data not otherwise available at an I/O pin. Yet another benefit is the ability to reduce the number of overall test points required for device access. With boundary scan, there are no physical test points. This can help lower board fabrication costs and increase package density.

Boundary scan provides a better set of diagnostics than other test techniques. Conventional techniques apply test vectors (patterns) to the inputs of the device and monitor the outputs. If there is a problem with the test, it can be time consuming to isolate the problem. Additional tests have to be run to isolate the failure. With JTAG boundary scan, the boundary scan registers observe device responses by monitoring the input pins of the device. This enables easy isolation of various classes of test failures, such as a pin not making contact with the circuit board. Boundary scan can be used for functional testing and debugging at various levels, from internal IC tests to board-level tests. The technology is even useful for hardware/software integration testing.

Though boundary scan is now the test scan chain design of choice, another kind of scan design is Level Sensitive Scan Design (LSSD), which uses separate system and scan clocks to distinguish between normal and test mode. Latches are used in pairs, each has a normal data input, data output and clock for system operation. For test operation, the two latches form a master/slave pair with one scan input, one scan output and non-overlapping scan clocks A and B which are held low during system operation but cause the scan data to be latched when pulsed high during scan. The advantages of using the LSSD design is that with LSSD, the testing issue is changed to a combination circuit test, instead of a sequential circuit test, and that LSSD testing adds controllability of the scan controller state variables. The disadvantages of LSSD testing are that the LSSD latches require greater area, more time is needed to latch a next state into LSSD registers and to scan test vectors in and out, and clock generation and allocation is more complicated. Other lesser used scan chain designs are Random Access Scan (RAS), and General Scan Design (GSD).

Both the LSSD, JTAG, or equivalent designs provide an interface or "back door" for a hardware or software hacker, i.e., a person unauthorized to access information contained in the scannable device, and more particularly, to gain access to and/or exit from the manufacturer's, or other authorized party's (manufacture's customer), proprietary information embedded in the device. There may be much economic gain to be had through hacking into the internal proprietary information of these scannable devices, as hacking can be used, for example, to enable or unlock features intended to be paid type upgrades. In these systems, encryption is often employed in an attempt to protect proprietary data. However recent advantages in hacking techniques have allowed hackers to overcome many encryption processes through the LSSD, JTAG, or equivalent test interfaces. For example, by analyzing the output patterns of LSSD, JTAG, or equivalent scannable systems, with a computer aided Karnaugh map or through output pattern inspection, a thief can extrapolate the scannable device's internal logic.

Further, in conventional integrated circuit device manufacturing, systems on chips (SOCs) and other devices are designed and produced for relatively specific purposes. In this type of a manufacturing process, inherently there are chips manufactured that are more advanced than others, and generally speaking, the more advanced chips may often include the ability to perform the functions of the lesser advanced chips. In this situation, it is often practical from a manufacturing cost standpoint to simply manufacture only the more advanced chips and use these chips for all applications, as the cost per chip is often negligible between the more advanced chips and the lesser advanced chips. In this situation the more complex chip may be implemented into configurations of lesser complexity with the unused or more advanced portions or modules of the chip disabled. Similarly, when a more complex chip is implemented into a lesser complex application, the manufacturer has the option of enabling the disabled portions of the chip to upgrade the chip as demands necessitate.

However, from a business standpoint, manufacturing a single chip for multiple complex applications and disabling the more advanced portions of complex chips used in configurations of lesser complexity can be problematic, as chip hackers may exploit the use of the more advanced chip in a configuration of less complexity, e.g., the hackers will use unauthorized methods to unlock the disabled modules of the chip. The unauthorized access to and/or exit from the disabled portions of the chip decreases the manufacturer's revenue such that the manufacturing cost savings incurred as a result of manufacturing only the more advanced chips are often eliminated. Further, in some cases, hacking may result in degradation of device reliability and possibly catastrophic failure (e.g., device overheating) if an operating frequency is increased. This may be particularly problematic for a manufacturer if the hacker is not the end user, for example, if the hacker is in the supply chain and passes on a hacked device to an unsuspecting end user who then returns it to the manufacturer or seeks remedy for damages from the manufacturer.

Accordingly, there is a need for methods and systems for preventing unauthorized access to and/or exit from internal device information through test interfaces, after the devices have left the manufacturing facility.

SUMMARY OF THE INVENTION

The present invention provides a method, apparatus and program product for providing controlled access to and/or exit from a portion of a scan chain (JTAG, LSSD, RAS, GSD, etc.) within a scannable device. The method, apparatus, and program product take advantage of a first controlling device placed within the scan chain prior to the portion of the scan chain to be controlled, a second controlling device placed within the scan chain just after the portion of the scan chain to be controlled, and an access control mechanism coupled to the first controlling device and the second controlling device, wherein the access control mechanism controls access to and/or exit from and/or exit from the portion of the scan chain between the first controlling device and the second controlling device.

A controlling device is a device capable of blocking access to and/or exit from the portion of the boundary scan chain when receiving a block signal, and allowing access to and/or exit from the portion of the boundary scan chain when receiving an access signal. The access control mechanism provides to the controlling devices either block or access signals. In doing so, the access control mechanism can selectively provide to the controlling devices signals to either block access or allow access.

In one embodiment of the invention a routine is used to instruct what signal the access control mechanism should send to controlling devices. To provide the access control mechanism with selective access functionality, the routine is selectively called. As an example, the routine may instruct the access control mechanism to operate in allow access mode, or alternatively block access mode. In allow access mode, the access control mechanism provides either to the first controlling device, second controlling device, or both an access signal. The one or more controlling devices may then allow access to and/or exit from the portion of the boundary scan chain that was either previously blocked or allowed. In another embodiment the access control mechanism is a TAP controller.

In another embodiment of the invention the computer routine contains programming instructions, and the first and second controlling devices are electronic fuses. The routine provides to the access control mechanism which signal the access control mechanism should provide to controlling devices. Under default conditions the routine is not called and the access control mechanism operates in default mode. However when the routine is called, the routine instructs the access control mechanism to program the electronic fuses. The access control mechanism then signals either the first, second, or both e-fuses. This signal provides the programming capability to the first, second, or both fuses. In yet another embodiment of the invention, the routine is removed. In this manner, the programming instruction is provided manually (i.e., an external tester). For example, the electronic fuses are programmed by providing the programming signal directly to each electronic fuse.

BRIEF DESCRIPTION OF THE DRAWINGS

Various embodiments of the present invention are hereinafter described in conjunction with the appended drawings:

FIG. 10A is a flow diagram of an exemplary method of blocking access to and/or exit from a portion of scan chain.

FIG. 10B is a flow diagram of an access control mechanism receiving a block instruction.

Figure 1:
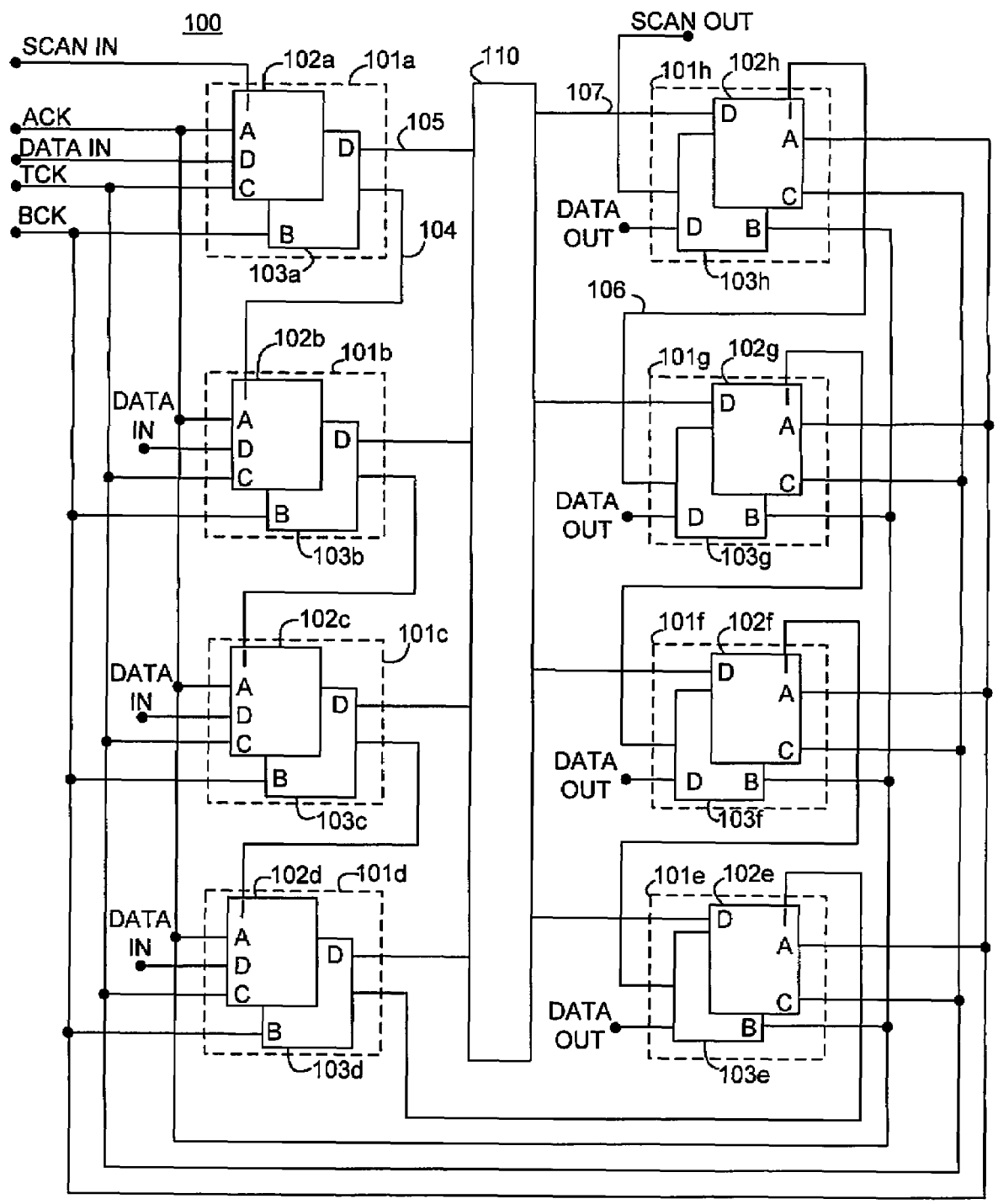
FIG. 1 depicts a prior art Level Sensitive Scan Design scan chain.

It is to be noted, however, that the appended drawings illustrate only example embodiments of the invention, and are therefore not considered limiting of its scope, for the invention may admit to other equally effective embodiments.

DETAILED DESCRIPTION

Embodiments of the present invention provide techniques and systems whereby operation of and/or access to and/or exit from particular logic of an electronic device may be controlled after the device has left the control of the manufacturer. The device may include a scan chain utilized for manufacturing, qualification, reliability, etc. However these scan chains can be used as a backdoor for hacking, or to provide an interface or "back door" for a hardware or software hacker, and more particularly, to gain access to and/or exit from the manufacturer's, or other authorized party's (manufacture's customer), proprietary information embedded in the device. Accordingly the embodiments of the invention teach the technique of controlling access to and/or exit from one or more portions of the scan chain.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the present invention generally include methods and systems configured to provide restricted access to and/or exit from specific internal components, i.e., designated internal storage elements containing proprietary information, of an integrated circuit device through an interface on the device that is used to test the device during a manufacturing process. Access to and/or exit from the internal components of the device may be allowed during the manufacturing process, as the methods and systems of the invention are generally not enabled until the device manufacturing process, including testing of the device, is completed. After the manufacturing process for the device is completed, the methods and systems of the invention are activated or provided to be activated. Thereafter, access to and/or exit from the internal components of the device is permitted selectively.

The embodiments of the invention may be implemented as program products for use with a computer or microprocessor-type system. The program product defines functions of the embodiments (including the methods described herein) and can be contained on a variety of computer readable media. Illustrative computer readable media include, but are not limited to: (i) information permanently stored on non-writable storage media (e.g., read-only memory devices within a computer such as CD-ROM disks readable by a CD-ROM drive);

and (ii) alterable information stored on writable storage media (e.g., floppy disks within a diskette drive or hard-disk drive) Such computer readable media, when carrying computer-readable instructions that direct the functions of the present invention, represent embodiments of the present invention The main idea of scan design is to obtain control and observability for flip-flops. A test protocol is incorporated into the scan design when all the flip-flops form one or more shifting registers connected to the internal logic of the scannable device. These are known as storage elements. The DATA IN inputs to these storage elements are coupled with the primary SCAN IN inputs and the outputs of the storage elements are multiplexed with the primary outputs. Therefore any flip-flop in the scan chain is able to be set to a particular value during the test protocol by shifting values. The logic values of the flip-flops are observed, in the same manner, by shifting out the values from the storage elements. Each flip-flop is able to be set or observed in terms of clock periods. All of the above described operations can be performed simultaneously. When one set of values in the storage elements is read, a new set is shifted in.

The usual procedure for testing scan chains is as follows: Switch to shift-register mode and load the initial state for a test pattern into the flip-flops. Return to the normal-function mode and apply the test input pattern. Switch to the shift-register mode and shift out the final state while shifting in the starting state for the next iteration. This way, one can design a sequential circuit such that it can be treated as a purely combinational circuit, with the flip-flop inputs and outputs treated as pseudo primary inputs and pseudo primary outputs, respectively. There are several variations of scan chain designs, including but not limited to, Level Sensitive Scan Design (LSSD), Random Access Scan (RAS), Boundary Scan, and General Scan Design (GSD).

FIG. 1 illustrates a prior art Level Sensitive Scan Design (LSSD) scan chain 100. LSSD scan chain 100 consists of a chain of storage elements 101a-101h. Each storage element 101a-101h contains master latches 102a-102h and slave latches 103a-103h. Storage elements 101a-101h, master latches 102a-102h, and slave latches 103a-103h are herein referred to generically as storage elements 101, master latches 102, and slave latches 103. Both the master latches 102 and slave latches 103 are controlled by multiple functional clocks to avoid a timing/race error; ACK, BCK. Master latches 102 are controlled by ACK, and slave latches 103 are controlled by BCK. Master latches 102 and slave latches 103 are never controlled with the same clock. In scan mode ACK is pulsed and the SCAN IN value is latched in master latches 102. When BCK is pulsed, the value of master latches 102 is copied to slave latches 103. ACK and BCK are never turned high simultaneously. When TCK is pulsed DATA IN, a value from an I/O pin (not shown), is latched into master latch 102. When BCK is pulsed, the value of master latches 102 is copied to slave latches 103. Again, ACK and BCK are never turned high simultaneously.

For example, after SCAN IN is latched by both master latch 102a and slave latch 103a, ACK is pulsed and the output scan value of slave latch 103a is latched into the next storage element of the scan chain: master latch 102b. The output scan value of slave latch 103a is connected to the input of master latch 102b by line 104. After DATA IN is latched by both master latch 102a and slave latch 103a, TCK is pulsed and the output data value of slave latch 103a is passed into internal logic and circuitry 110. The output data value of slave latch 103a is connected to internal logic and circuitry 100 by line 105. In some applications line 104 and line 105 are the same line. Similarly, in some applications lines 106 and 107 are the same line.

The DATA IN of storage elements 101a-101d is typically an input from an I/O pin (not shown). Though only four such storage elements, i.e. 101a-101d, are shown, there can be a plurality of such storage elements. Alternatively, DATA IN of storage elements 101a-101d can also be DATA OUT from a previous scan chain. Upon exit from slave latches 103, the DATA output of storage elements 101a-101d is received by internal logic 100, and after processing becomes DATA IN for any one or more storage elements 101e-101h. DATA IN for storage elements 101e-101h is latched through master and slave latches 102 and 103 as described above and ultimately becomes DATA OUT of storage elements 101e-101h. DATA OUT of storage elements 101e-101h is typically routed to an I/O pin. Alternatively DATA OUT can also be DATA IN for a subsequent scan chain. The scan output of the last storage element 101e in the chain is SCANOUT.

Figure 2:
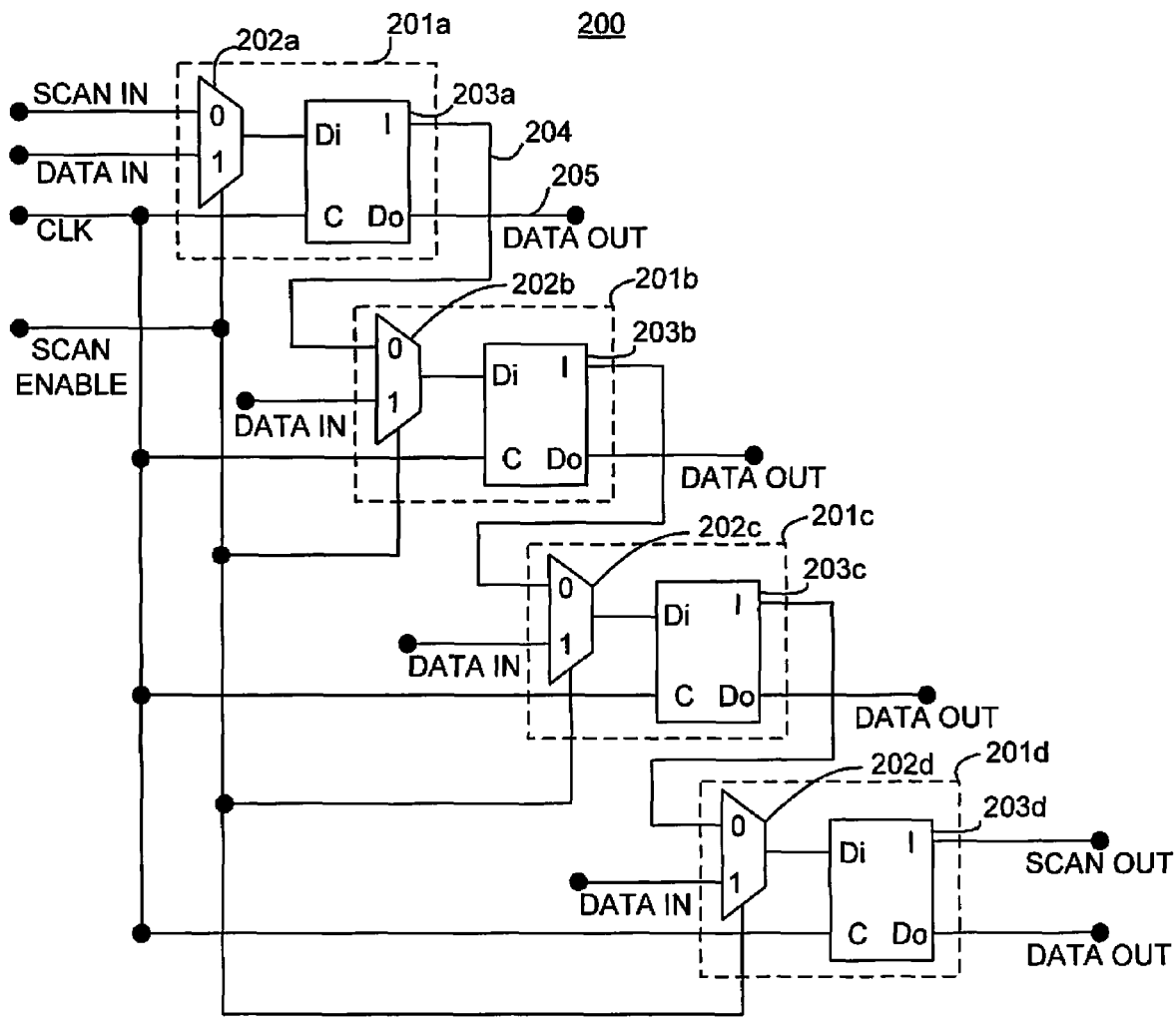
FIG. 2 depicts a prior art General Scan Design scan chain.

FIG. 2 illustrates prior art General Scan Design (GSD) scan chain 200. GSD scan chain 200 is an illustrative example of a scan chain using one functional clock, and an alternative configuration of storage elements. In LSSD there is a benefit that no timing error will occur because a scan test will be conducted by using two independent functional clock signals, thereby eliminating the possibility of a race condition. However the size of the LSSD chain will be increased. In this manner, the circuit structure of the GSD is simplified as compared with that of the LSSD. Referring to FIG. 2, an illustrated embodiment of the invention, GSD scan chain 200 contains multiple storage elements 201a-201d. Within storage elements 201a-201d there are multiplexers 202a-202d and edge triggered latches 203a-203d. Within edge triggered latches 203 there is a flip-flop circuit (not shown). Storage elements 201a-201d, multiplexers 202a-202d, and edge triggered latches 203-203d are hereby referred to generically as storage elements 201, multiplexers 202, and edge triggered latches 203.

Multiplexers 202 receive a SCAN IN signal and a DATA IN signal at corresponding inputs 0 and 1 respectively, and depending upon the SCAN ENABLE instruction received multiplexers 202 pass either the SCAN or DATA signal to edge triggered latches 203. Normally the SCAN ENABLE instruction is low wherein DATA passes to and/or from I/O pins (not shown) or multiple internal logic (not shown). Therefore in normal operation multiplexers 202 receive a low signal from SCAN ENABLE. When SCAN ENABLE is low, multiplexer chooses DATA IN to pass to edge triggered latches 203. When SCAN ENABLE is high, multiplexers chooses SCAN IN to pass to edge triggered latches 203.

Edge triggered latches 203 receive either SCAN or DATA signals from multiplexers 202 and are controlled by functional clock CLK. When CLK toggles from low to high, the signal from multiplexer 202 is latched into edge triggered latch 203 and passed through to either I or Do. For example, the output signal from edge triggered latch 203a exits edge triggered latch 203a on either scan line 204 or data line 205. If edge triggered latch 203a receives the SCAN signal from multiplexer 201a, the output of edge triggered latch 203a will be of the SCAN type and proceed on scan line 204 to storage element 201b. If edge triggered latch 203a receives the DATA signal from multiplexer 201a, the output of edge triggered latch 203a will be of the DATA type and proceed on data line 205 to either internal logic (not shown) or as the output of a I/O pin (not shown). In some applications signal line 204 and data line 205 are combined as one line. The scan output from the last storage element in the chain, i.e., storage element 203d, is SCAN OUT.

Figure 3:
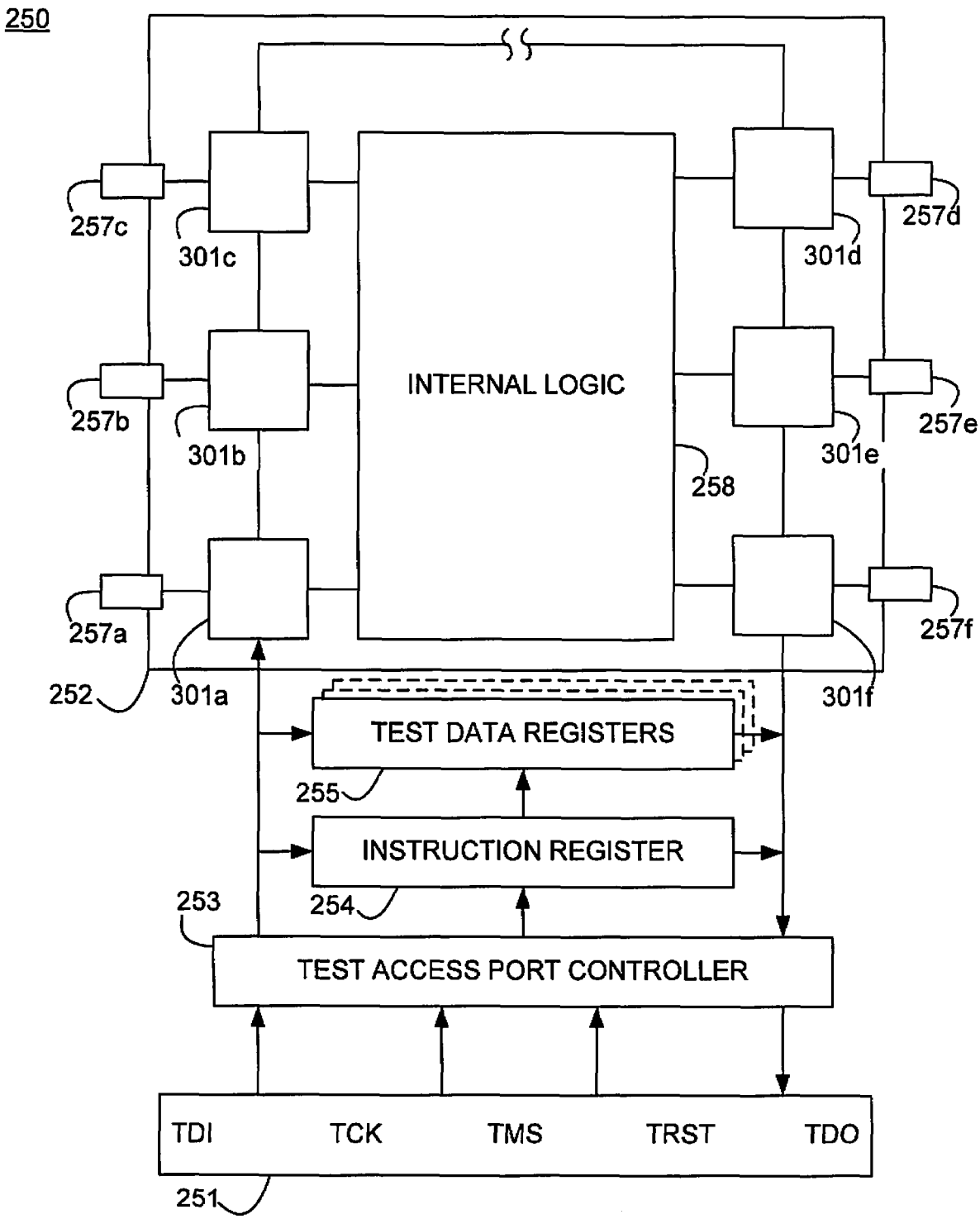
FIG. 3 depicts a prior art JTAG scan chain.

FIG. 3 illustrates a JTAG boundary scannable system 250 having a boundary scannable IC 252 having internal logic 258. Boundary-scan control signals, collectively referred to as a Test Access Port (TAP) 251, define a serial shifting protocol for boundary scannable IC 252. The first of these signals, TCK (test clock) synchronizes the internal state machine operations. The second signal, TMS (test mode select) is sampled at the rising edge of TCK to determine the next state. The third signal, TDI (test data in) is sampled at the rising edge of TCK and is shifted into the device's test or programming logic when the internal state machine is in the correct state. The fourth signal, TDO (test data out) represents the data shifted out of the device's test or programming logic and is valid on the falling edge of TCK when the internal state machine is in the correct state. Finally, the TRST/reset (optional) signal, when driven low, resets the internal state machine. In addition to TAP 251, boundary scannable IC 252 also contains the following devices: a TAP Controller 253, an instruction register 254, at least one scannable test data register 255, and multiple storage elements 301a-301f. The TCK, TMS and TRST input pins drive a 16-state TAP controller 253. For example, TAP controller 253 manages the exchange of scan type data from storage elements 301b to the subsequent storage element 301c, and normal operating data wherein input is received from I/O pin 257b, passes through storage element 301b into internal logic 258, and ultimately through storage element 301e resulting as an output on I/O pin 257e. Note storage elements 301 are generically depicted as storage elements and can use various storage element configurations such as the configuration of storage elements 101 and storage elements 201.

TAP controller 253 advances to a new state based on the value of the TMS signal at each rising edge of TCK. With the proper wiring, multiple boundary scannable IC 252 can be tested simultaneously. In normal operation, instruction register 254 receives an instruction from TAP controller 253 (i.e., through TDI), decodes it, and selects the appropriate test data register 255 depending on the state of TAP controller 253. Instruction register 254 is used to set the mode of operation for one or more test data registers 255, and is controlled by the TAP 251, and can be placed between TDI and TDO for loading and unloading shifted data. In addition to test data registers 255, numerous other registers including a bypass register (not shown), device identity register (not shown), and multiple user defined registers (not shown) can be utilized. The particular register of operation is dictated by an instruction from instruction register 254. Multiple storage elements 301a-301f are placed adjacent to each I/O pin 257a-257f, permitting serialization of data into and out of boundary scannable IC 252. Storage elements 301a-301f allow for a tester to control and observe boundary scannable IC 252 behavior using scan testing principles.

Figure 4:
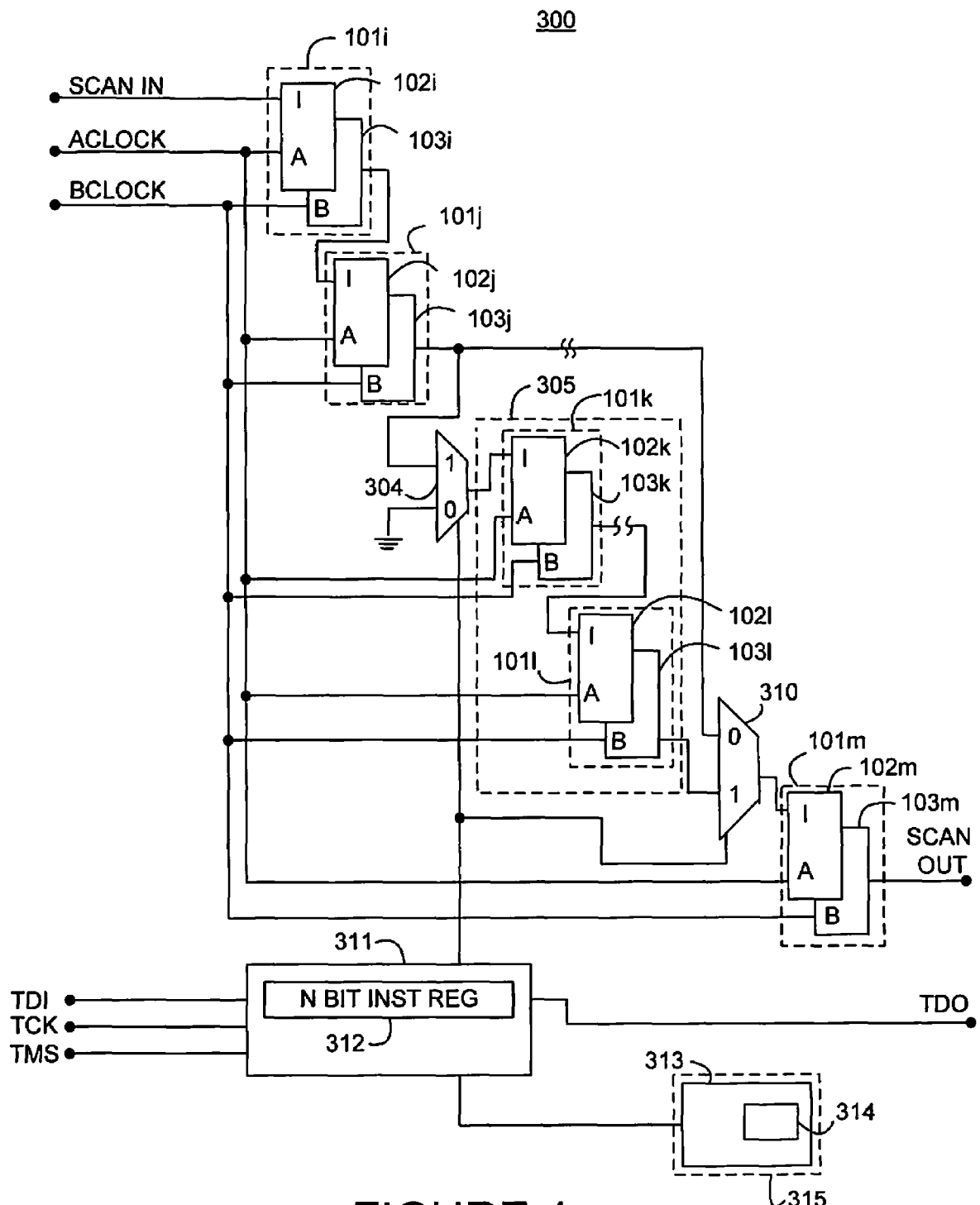
FIG. 4 depicts a Level Sensitive Scan Design chain wherein access to and/or exit from a portion of the chain is controlled with a TAP controller.

FIG. 4 depicts an embodiment of the invention; LSSD chain 300 wherein access to and/or exit from a protected portion 305 of the chain is controlled by controlling devices 304 and 310. Note that the elements utilized in the shifting of data from an input of an I/O pin, through a storage element 101, through internal logic, and ultimately through an I/O pin (DATA IN, TCK, I/O pin, internal logic, etc.) as an output shown in FIG. 1 are not shown in FIG. 4 for simplicity.

Protected portion 305 is a section of scan chain having one or more storage elements 101k and 101l, wherein a first controlling device 304 is placed just prior to protected portion 305 and a second controlling device 310 is placed just after protected portion 305. Controlling devices 304 and 310 are devices capable of blocking access to and/or exit from the protected portion 305 of the LSSD scan chain 300 when receiving a block signal, and allowing access to and/or exit from the protected portion 305 of the LSSD scan chain 300 when receiving an access signal. As shown in FIG. 3 controlling devices 304 and 310 are multiplexers. However controlling devices 304 and 310 can be any device capable of changing an output logic value upon receipt of stimulation.

Access control mechanism 311 provides controlling devices 304 and 310 with either block or access signals. Depending on the type of device utilized as controlling devices 304 and 310, access control mechanism 311 can provide signals other than block or access signals. The block, access, or other signals are generated and provided to controlling devices 304 and 310 selectively. As shown in FIG. 4, access control mechanism 311 is a TAP controller, however access control mechanism 311 can be other mechanisms capable of selectively providing one or more signal types (i.e., block signal, access signal, program signal, etc.) to one or more controlling devices 304 and 310.

As a representative embodiment, when controlling devices 304 and 310 are receiving a block signal from access control mechanism 311, controlling devices 304 and 310 select the 0 input to pass to the subsequent storage element 101. For example, when controlling device is receiving a low (0) signal from access control mechanism 311, the output from storage element 101j is not selected to be passed to storage element 101k by controlling device 304. Rather controlling device 304 selects a null/ground signal (the signal corresponding to controlling device 304 input 0). The null/ground scan value is shifted through storage elements 101k and 101l thereby creating protected portion 305. Controlling device 310 is also receiving a low (0) signal from access control mechanism 311. The null/ground value previously shifted through storage elements 101k and 101l is not selected to be passed to storage element 101m by controlling device 310. Rather the value exiting storage element 101j is selected as the input to storage element 101m (the signal corresponding to controlling device 310 input 0).

When controlling devices 304 and 310 are receiving an access signal from access control mechanism 311, controlling devices 304 and 310 select the 1 input to pass to the subsequent storage element 101. For example, the output from storage element 101j is selected to be passed to storage element 101k by controlling device 304 (the signal corresponding to the input 1). This scan value is then shifted through storage elements 101k and 101l. Controlling device 310 is also receiving a high (1) signal from access control mechanism 311. The value previously shifted through storage elements 101k and 102l is selected to be passed to storage element 101m by controlling device 310 (the signal corresponding to input 1).

Therefore depending on what signal the controlling devices 304 and 310 are receiving from access control mechanism 311, the controlling devices 304 and 310 select different signals to pass to the subsequent storage element. (i.e., a low (0) signal from access control 311 results in controlling devices 304 and 310 passing the null/ground signal, and high (1) signal from access control mechanism 311 results in controlling devices 304 and 310 passing the value in the prior storage element 101). The low (0) signal sent from access control mechanism 311 results in a protected portion of scan chain 305 being bypassed in the scan test. The high (1) signal sent from access control mechanism 311 results in the protected portion of scan chain 305 being included in the scan test.

As a representative embodiment shown in FIG. 4, access control mechanism 311 is depicted as a TAP controller wherein the TAP controller provides access or block signals to controlling devices 304 and 310 in a LSSD scan design. Though traditionally a TAP controller is not utilized in a LSSD scan design, methods and apparatus are known in the art of including a TAP Controller into a LSSD scan design to take advantage of the functionality of the TAP Controller. One such method and apparatus is described in U.S. Pat. No. 5,497,378, Amini et al., System and Method for Testing a Circuit Network Having Elements Testable by Different Boundary Scan Structures, herein incorporated by reference. Because adding a TAP controller to various scan chain designs is known in the art, the scope of the representative embodiment should not limited to JTAG boundary scan chain designs, but should include other scan designs as well (LSSD, RAS, GSD, etc.).

Access control mechanism 311 selectively generates and provides access, block, or other signals to controlling devices 304 and 310 upon receipt of instruction 314 located in a routine 313. Routine 313 is a hardware or software processor capable of holding and/or processing a sequence of instructions 314 called by the access control mechanism 311. Instructions 314 are used to control what signal access control mechanism 311 passes to controlling devices 304 and 310. In order to provide access control mechanism 311 selective access functionality, routine 313 is selectively called. Routine 313 is called when an authorized user of the boundary scannable device identifies routine characteristic 315. In essence routine characteristic 315 is a "password" to allow signal access to or exit from the protected portion 305. An authorized user is defined as a person, company, corporation, etc. authorized by the scannable device's manufacturer to access information contained in the scannable device, and or authorized to perform a scan test (JTAG, LSSD, etc.).

When an authorized user desires to perform a scan test including protection portion 305, they must identify routine characteristic 315. Routine characteristic 315 may be the routine 313 location having a corresponding location code. However routine characteristic 315 can take advantage of any characteristic of routine 313 wherein the authorized user can identify routine 313 by the particular routine 315 characteristic. As a representative embodiment, wherein routine characteristic 315 is the routine 313 location, having a corresponding location code, in order to permit access to and/or exit from protected portion 305 when perform a scan test, the authorized user must input a correct location code 315 into access control mechanism 311.

Access control mechanism 311 is configured to recognize and accept either routine characteristic 315 or a derivative code or signal corresponding to routine characteristic 315. Once the routine characteristic 315 or a derivative code or signal corresponding to routine characteristic 315 is accepted, access control mechanism 311 processes the routine characteristic 315 or a derivative code or signal corresponding to routine characteristic 315 by calling routine 313. If the routine characteristic 315 or a derivative code or signal corresponding to routine characteristic 315 is not recognized by access control mechanism 311, access control mechanism 311 will not call routine 313. When routine 313 is called, access control mechanism 311 accepts instruction 314, and ultimately provides either a block or access signal to controlling devices 304 and 310.

A representative implementation of the invention as shown in FIG. 4 is now described. A manufacturer tests a scannable device containing LSSD chain 300, and upon a successful LSSD test sets the operation state of the scannable device to a block state. A block (low (0)) state as described above forces control devices 304 and 310 to block access to and/or exit from the protected portion 305 of LSSD scan chain 300. The manufacturer sells the device to either an authorized or unauthorized user. If the customer is an authorized user, the manufacturer makes available to the authorized user a particular routine characteristic 315. Because in today's marketplace the authorized user can in turn sell the device to a $3^{rd}$ party, it is beneficial for the manufacturer choose a distribution system that allows the manufacturer to selectively make available the particular routine characteristic 315 depending on the end user. In this manner the authorized user can request to the manufacturer to never make available the particular routine characteristic 315. This would be beneficial if it is known by the authorized user that under no future circumstance should there be a fully scannable (no protected portion 305) LSSD chain 300. If the customer is an unauthorized user, the manufacturer will not make available to the unauthorized user a particular routine characteristic 315. This creates LSSD chain 300 having protected portion 305, wherein the unauthorized user can perform a partial scan.

If the authorized user desires to perform a full scan of LSSD chain 300, wherein access to and/or exit from the protected portion 305 is allowed, the authorized user must change the state of the scannable device from a block (low (0)) state to an access (high (1)) state. In this manner the authorized user enters a routine location or a code corresponding to the routine location, i.e., routine characteristic 315, or a derivative code or signal corresponding to routine characteristic 315 as a TDI into the TAP controller. Instruction register 312, located in the TAP controller receives the routine location or a code corresponding to the routine location through TDI, decodes it, and calls routine 313. Upon receipt of instruction 314, i.e. access instruction, the TAP controller sends to controlling devices 304 and 310 an access (high (1)) signal.

Figure 5:
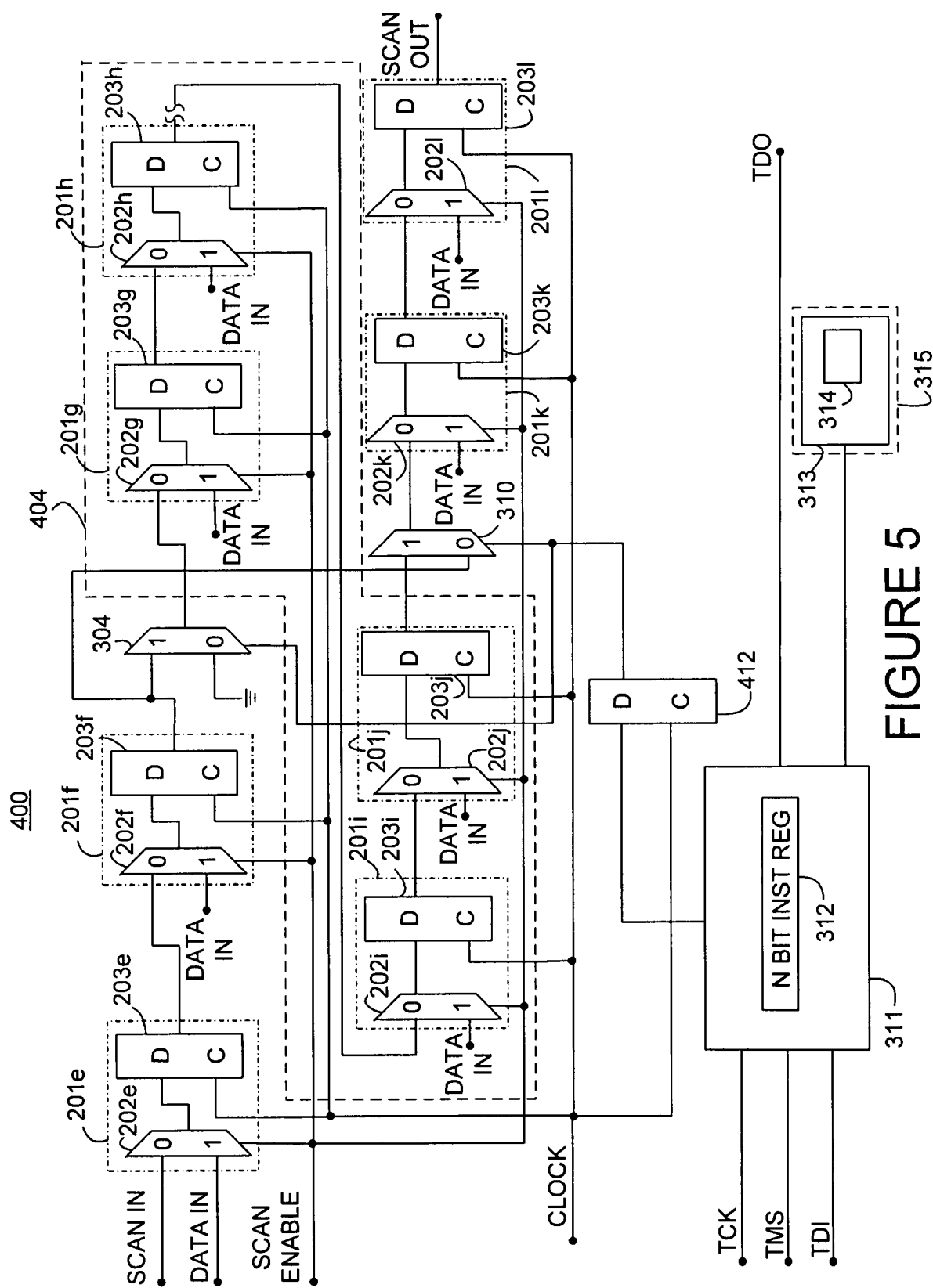
FIG. 5 depicts a GSD scan chain wherein access to and/or exit from a portion of the chain is controlled with a TAP controller.

FIG. 5 depicts another embodiment of the invention; GSD scan chain 400 wherein access to and/or exit from a protected portion 404 of the chain is controlled by controlling devices 304 and 310. It is noted that the elements utilized in the shifting of data from an input coming from an I/O pin, through storage element 101, through internal logic, and ultimately through an I/O pin (DATA OUT, I/O pin, etc.) as an output are not shown in FIG. 5 for simplicity. The figures for edge triggered latches 203 are also simplified as compared with FIG. 2.

When controlling devices 304 and 310 are receiving a block signal from access control mechanism 311, controlling devices 304 and 310 select the signal corresponding to input 0 to pass to a subsequent storage element. For example, when access control mechanism 311 sends controlling device 304 a block (low (0)) signal the output from storage element 201$f$ is not selected to be passed to storage element 201$g$. Rather controlling device 304 selects a null/ground scan value to pass to storage element 201$g$. The null/ground scan value is shifted through storage elements 201$g$, 201$h$, 202$l$, and 201$j$ thereby creating protected portion 404. Controlling device 310 is also receiving a low (0) signal from access control mechanism 311. The null/ground scan value previously shifted through storage elements 201$g$, 201$h$, 202$l$, and 201$j$ is not selected to be passed to storage element 201$k$ by controlling device 310. Rather the value exiting storage element 201$f$ is selected by controlling device 310 to be passed to storage element 201$k$.

When access control mechanism 311 sends controlling device 304 a access (high (1)) signal the output from storage element 201$f$ is selected to be passed to storage element 201$g$.

This scan value is then shifted through storage elements 201*g*, 201*h*, 202*l*, and 201*j*. Controlling device 310 is also receiving a high (1) signal from access control mechanism 311. The value previously shifted through storage elements 201*g*, 201*h*, 202*l*, and 201*j* is selected to be passed to storage element 201*k* by controlling device 310.

Therefore depending on what signal the controlling devices 304 and 310 are receiving from access control mechanism 311, the controlling devices 304 and 310 select different signals to pass to the subsequent storage element. (i.e., a low (0) signal from access control mechanism 311 results in controlling devices 304 and 310 passing the null/ground signal, and high (1) signal from access control mechanism 311 results in the controlling devices 304 and 310 passing the value in the prior storage element 201). The low (0) signal from access control mechanism 311 results in a protected portion of scan chain 305 being bypassed in the scan test. The high (1) signal from access control mechanism 311 results in the protected portion of scan chain 305 being included in the scan test.

In the present embodiment latch 412 is added. Latch 412 is a set or reset dominant latch, such that when the access control mechanism 311 ceases providing access signals, i.e., on system power down, to controlling devices 304 and 310, latch 412 sends low (0) signals to the controlling devices 304 and 310, wherein access to and/or exit from protected portion 404 is blocked. In this manner the default state of the controlling devices 304 and 310 are low (0) wherein signal access to and or exit from protected portion 404 is prohibited. It is advantageous to add latch 412 to ensure a default operation mode where signal access to and/or exit from protected portion 404 is prohibited.

Figure 6:
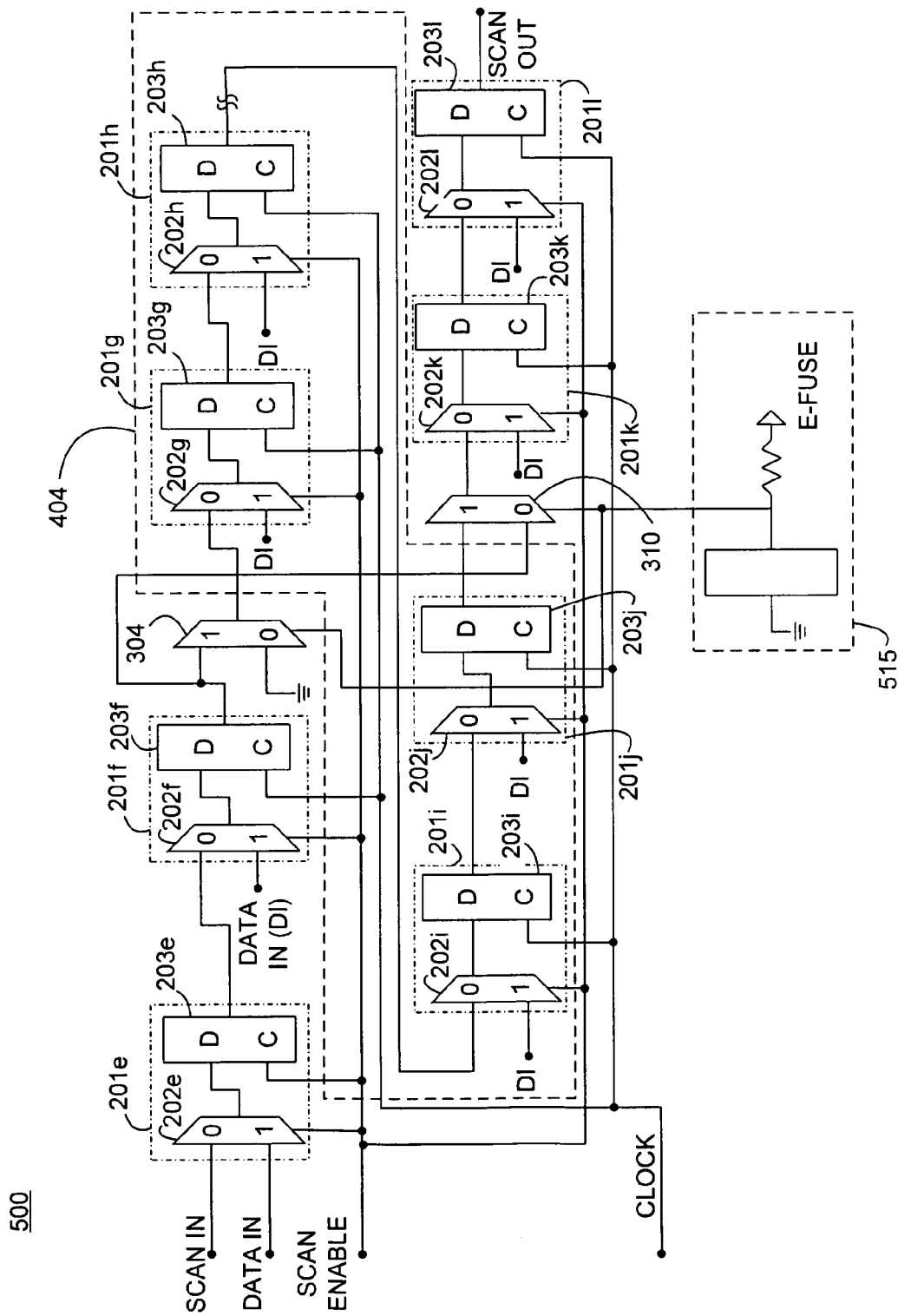
FIG. 6 depicts a scan chain wherein access to and/or exit from a portion of the chain is controlled with an E-fuse.

FIG. 6 depicts another embodiment of the invention; GSD scan chain 500 wherein the access control mechanism 515 is shown as an eFUSE. An eFUSE generally comprises a programmable element that is programmed after the completion of manufacturing and testing processes for the device having scan chain 500. The eFUSE is programmed to either be intact or blown, where an intact eFUSE is electrically conductive under normal device operating parameters, and where a blown eFUSE is normally not conductive under normal device operating parameters. The conductive or intact state of the eFUSE may be used to generate a high (1) signal to be provided to controlling devices 304 and 310, and the blown or non-conductive state may be used to generate a low (0) signal provided to controlling devise 304 and 310. eFUSE control logic (not shown) may be included to control the blowing of the eFUSE by applying a blow voltage. The blow voltage may be received from an external testing device (not shown), for example, during the manufacturing and/or testing process.

When controlling devices 304 and 310 are receiving a low (0) signal from access control mechanism 311, controlling devices 304 and 310 select the signal corresponding to input 0 to pass to a subsequent storage element. For example, when access control mechanism 311 sends controlling device 304 a low (0) signal the output from storage element 201*f* is not selected to be passed to storage element 201*g*. Rather controlling device 304 selects a null/ground scan value to pass to storage element 201*g*. The null/ground scan value is shifted through storage elements 201*g*, 201*h*, 202*l*, and 201*j* thereby creating protected portion 404. Controlling device 310 is also receiving a low (0) signal from access control mechanism 311. The null/ground scan value previously shifted through storage elements 201*g*, 201*h*, 202*l*, and 201*j* is not selected to be passed to storage element 201*k* by controlling device 310. Rather the value exiting storage element 201*f* is selected by controlling device 310 to be passed to storage element 201*k*.

When access control mechanism 311 sends controlling device 304 a access (high (1)) signal the output from storage element 201*f* is selected to be passed to storage element 201*g*. This scan value is then shifted through storage elements 201*g*, 201*h*, 202*l*, and 201*j*. Controlling device 310 is also receiving a high (1) signal from access control mechanism 311. The value previously shifted through storage elements 201*g*, 201*h*, 202*l*, and 201*j* is selected to be passed to storage element 201*k* by controlling device 310.

Therefore depending on what signal the controlling devices 304 and 310 are receiving from access control mechanism 311, the controlling devices 304 and 310 select different signals to pass to the subsequent storage element (i.e., a low (0) signal from access control mechanism 311 results in controlling devices 304 and 310 passing the null/ground signal, and high (1) signal from access control mechanism 311 results in the controlling devices 304 and 310 passing the value in the prior storage element 201). The low (0) signal from access control mechanism 311 results in a protected portion of scan chain 305 being bypassed in the scan test. The high (1) signal from access control mechanism 311 results in the protected portion of scan chain 305 being included in the scan test.

It is noted that in the present embodiment, once the eFUSE is blown, the eFUSE is not able to revert to a pre blown state. Therefore once the eFUSE provides to the controlling devices 304 and 310 a low (0) or block signal, controlling devices 304 and 310 will forever select the value corresponding to input 0. If selectivity is desired an alternative embodiment wherein access control mechanism 515 is a plurality of eFUSEs, i.e., eFUSE bank is provided. In this embodiment one eFUSE associated with the plurality of eFUSEs may be blown resulting in the access control mechanism sending a low (0) or block signal to controlling devices 304 and 310. As described above, this results in blocking signal access to and/or exit from protected portion 404. If it is then desired to allow signal access to and/or exit from protected portion 404 another eFUSE, that has not been previously blown associated with the plurality of eFUSEs, can send to controlling devices 304 and 310 a high (1) or access instruction. This requires additional logic to provide the means to switch the eFUSE connected to controlling devices 304 and 310. The additional logic can provide the means of switching from a previously blow eFUSE to a non blown eFUSE. Once the non blown eFUSE is connected to controlling devices 304 and 310, the non blown eFUSE can send controlling devices 304 and 310 a high (1) or access signal. As described above a high (1) or access signal received by controlling devices 304 and 310 results in allowing a scan of the full scan chain 500 including protected portion 404. Once the full scan is completed, and it is desired to once again block access to protected portion 404 in a subsequent scan, the previously un-blown eFUSE may be blown resulting in signal access and/or exit being prohibited.

One skilled in the art will recognize that the eFUSE may be initially in a non-conductive state and programmed to a non-conductive (blown) state, as described above or, alternatively, may initially be in a non-conductive state and programmed to a conductive state (the latter eFUSE are commonly referred to as an antifuse). Antifuses generally are comprised of two conductors separated by an insulator. Programming is accomplished by forming a conductive trace through the insulator, and changing an open to a conductive element.

Figure 7:
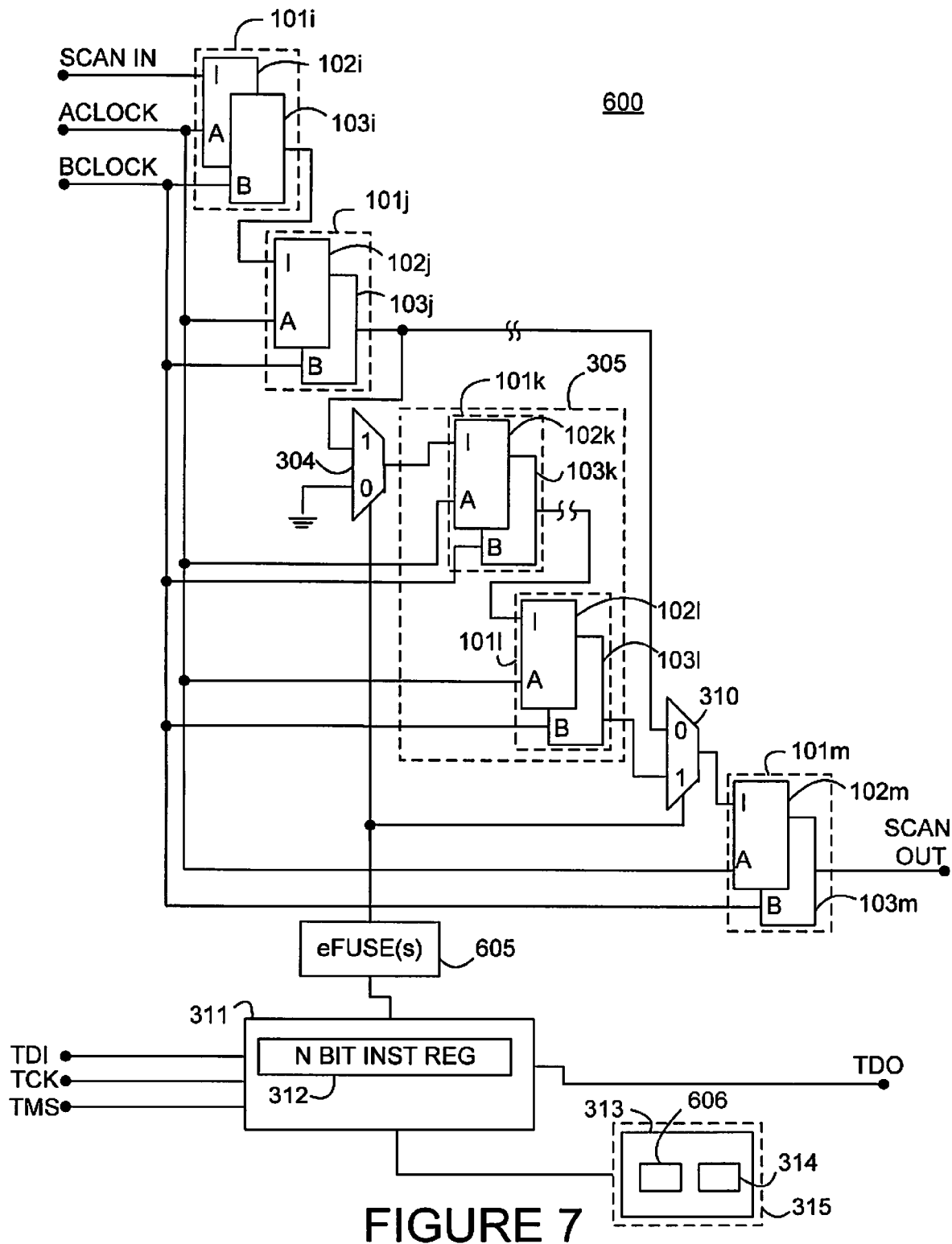
FIG. 7 depicts a scan chain wherein access to and/or exit from a portion of the chain is controlled with a TAP controller and E-fuse controlling devices.

FIG. 7 depicts another embodiment of the invention; scan chain 600 wherein access to and/or exit from a protected portion 305 of the chain is controlled by controlling devices 304 and 310 wherein access control mechanism 311 programs eFUSE(s) 605 where in turn eFUSE(s) 605 provides a low (0) signal to controlling devices 304 and 310. The present embodiment is advantageous in that one is able to control blowing eFUSE(s) 605 with access control mechanism 311, i.e. a TAP controller.

In the present embodiment, instruction 314 is a program instruction (i.e., blow instruction) that provides to access control mechanism 311 an instruction to send a program signal to eFUSE(s) 605. When a user identifies routine characteristic 313, access control mechanism 311 calls routine 315. Access control mechanism 311 then provides to eFUSE 605 a blow signal. Note, in the present embodiment access control mechanism does not send block or access signals to controlling devices 304 and 310, rather access control mechanism sends to eFUSE(s) 605 a blow signal. When eFUSE(s) receive a blow signal from access mechanism 311 eFUSE(s) blow, thereby creating a non-conductive state. The non-conductive state is used to generate a low (0) or block signal that is provided to controlling devices 304 and 310. eFUSE voltage source (not shown) may be included to provide for the blowing of the eFUSEs by applying a blow voltage to eFUSE 605. As described above, a low (0) signal provided to controlling devices 304 and 310 results in a protected portion 305 of scan chain 600 being bypassed in the scan test.

When controlling devices 304 and 310 are receiving a low (0) signal from eFUSE(s) 605, controlling devices 304 and 310 select the signal corresponding to input 0 to pass to a subsequent storage element. For example, when access control mechanism 311 sends controlling device 304 a low (0) or block signal the output from storage element 101*j* is not selected to be passed to storage element 101*k*. Rather controlling device 304 selects the null/ground scan value to pass to storage element 101*k*. The null/ground scan value is shifted through storage elements 101*k* and 101*l* thereby creating protected portion 305. Controlling device 310 is also receiving a low (0) signal from access control mechanism 311. The null/ground scan value previously shifted through storage elements 101*k* and 101*l* is not selected to be passed to storage element 101*m* by controlling device 310. Rather the value exiting storage element 101*j* is selected by controlling device 310 to be passed to storage element 101*m*. Therefore the low (0) signal from eFUSE(s) 605 result in a protected portion of scan chain 305 being bypassed in the scan test.

It is noted that in an alternative embodiment selectively is provided wherein eFUSE(s) 605 is a plurality of eFUSEs, i.e., eFUSE bank. In this embodiment one particular eFUSE in eFUSE(s) 605 may be blown resulting in eFUSE(s) 605 sending a low (0) or block signal to controlling devices 304 and 310. As described above, this results in blocking signal access to and/or exit from protected portion 305. If it is then desired to allow signal access to and/or exit from protected portion 305 another eFUSE, that has not been previously blown in eFUSE(s) 605 can send to controlling devices 304 and 310 a high (1) or access instruction. Access control mechanism 311 provides additional logic to switch the previously blown eFUSE connected to controlling devices 304 and 310 in eFUSE(s) 605 to an un-blown eFUSE in eFUSE(s) 605. Instruction 606, i.e., a change eFUSE instruction, provides to access control mechanism 311 an instruction to switch a previously blown eFUSE to a non-blown eFUSE. Instruction 606 can be called by access control mechanism similarly to instruction 314. Once the un-blown eFUSE is connected to controlling devices 304 and 310, the un-blown eFUSE sends controlling devices 304 and 310 a high (1) or access signal. As described above a high (1) or access signal received by controlling devices 304 and 310 results in allowing a scan of the full scan chain 600 including protected portion 305. Once the full scan is completed, and it is desired to once again block access to protected portion 305 in a subsequent scan, the previously un-blown eFUSE may be blown resulting in signal access and/or exit being prohibited.

Figure 8:
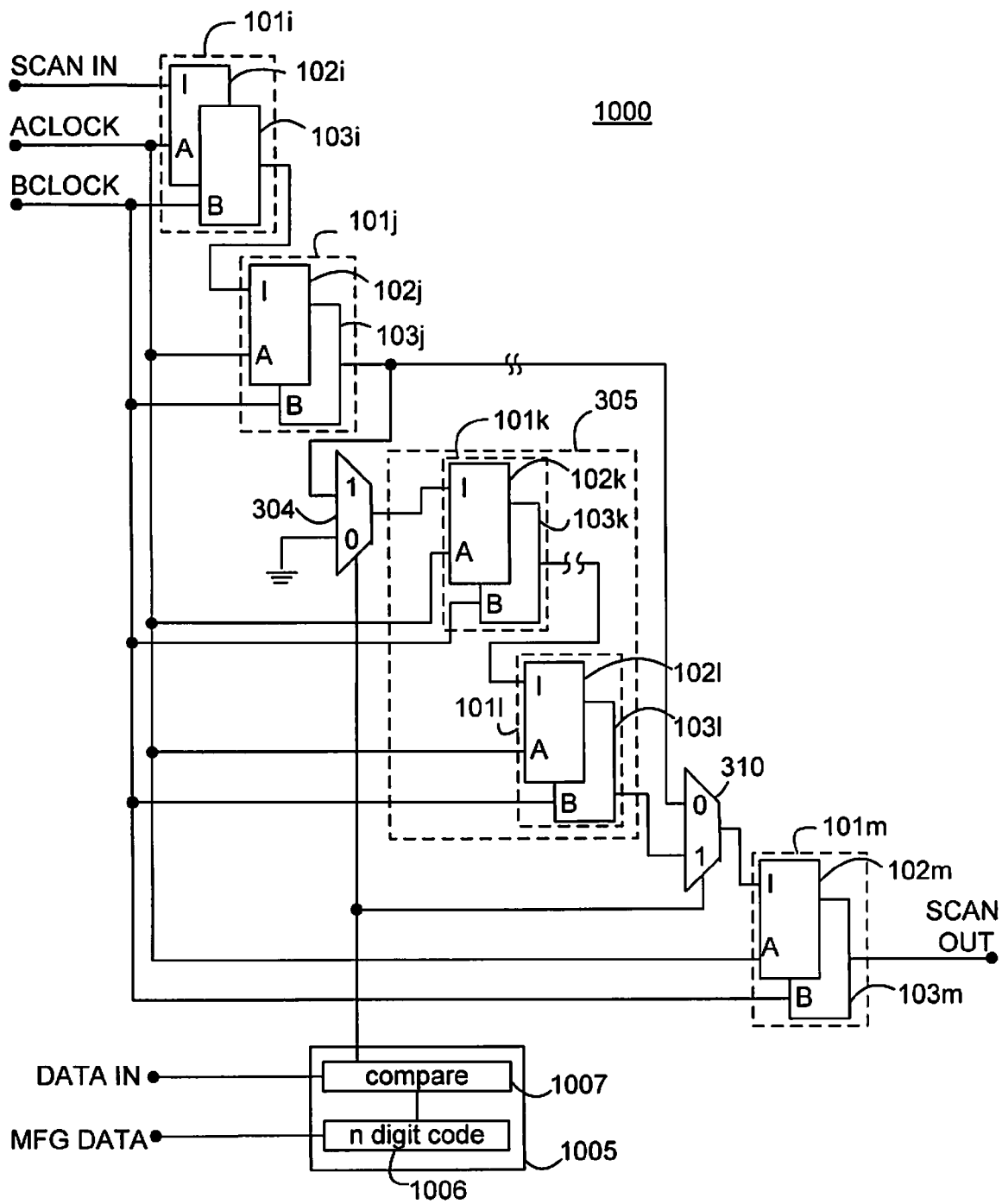
FIG. 8 depicts a scan chain wherein access to and/or exit from a portion of the chain is controlled wherein the access control mechanism is an application specific integrated circuit (ASIC).

FIG. 8 depicts an embodiment of the invention; scan chain 1000 wherein the access control mechanism 1005 is shown as an application specific integrated circuit (ASIC). Within access control mechanism 1005 there is an electrically erasable programmable read only memory (EEPROM) 1006. During manufacturing of the scannable device containing scan chain 1000, the manufacturer programs EEPROM 1006 with an n digit access code and an n digit block code. Also contained within control mechanism 1005 is a compare function 1007. Compare function 1007 receives data from a user of the scannable device containing scan chain 1000.

Access control mechanism 1005 provides controlling devices 304 and 310 with either block or access signals. The block, access, or other signals are generated and provided to controlling devices 304 and 310 selectively. For example, a block signal is generated by access control mechanism 1005 by inputting a block code as DATA IN into compare function 1007. Compare function 1007 then compares the inputted block code with the n digit block code the manufacturer programmed into EEPROM 1006. If the block codes match, access control mechanism 1005 provides to controlling devices 304 and 310 a low (0) or block signal. Alternatively an access signal is generated by the access control mechanism by inputting an access code as DATA IN into compare function 1007. Compare function 1007 then compares the inputted access code with the n digit access code the manufacturer programmed into EEPROM 1006. If the access codes match, access control mechanism 1005 provides to controlling devices 304 and 310 a high (1) or access signal.

When controlling devices 304 and 310 are receiving a low (0) signal from access control mechanism 1005, controlling devices 304 and 310 select the signal corresponding to input 0 to pass to a subsequent storage element. For example, when access control mechanism 1005 sends controlling device 304 a low (0) or block signal the output from storage element 101*j* is not selected to be passed to storage element 101*k*. Rather controlling device 304 selects the null/ground scan value to pass to storage element 101*k*. The null/ground scan value is shifted through storage elements 101*k* and 101*l* thereby creating protected portion 305. Controlling device 310 is also receiving a low (0) signal from access control mechanism 311. The null/ground scan value previously shifted through storage elements 101*k* and 101*l* is not selected to be passed to storage element 101*m* by controlling device 310. Rather the value exiting storage element 101*j* is selected by controlling device 310 to be passed to storage element 101*m*.

When controlling devices 304 and 310 are receiving an high (1) or access signal from access control mechanism 1005, controlling devices 304 and 310 select the 1 input to pass to storage element 101*k*. This scan value is then shifted through storage elements 101*k* and 101*l*. Controlling device 310 is also receiving a high (1) signal from access control mechanism 311. The value previously shifted through storage elements 101*k* and 102*l* is selected to be passed to storage element 101*m* by controlling device 310.

Therefore depending on what signal the controlling devices 304 and 310 are receiving from access control mechanism 1005, the controlling devices 304 and 310 select different signals to pass to the subsequent storage element. The low (0) signal sent from access control mechanism 1005 results in a protected portion of scan chain 305 being bypassed in the scan test. The high (1) signal sent from access control mechanism 311 results in the protected portion of scan chain 305 being included in the scan test.

Figure 9A:
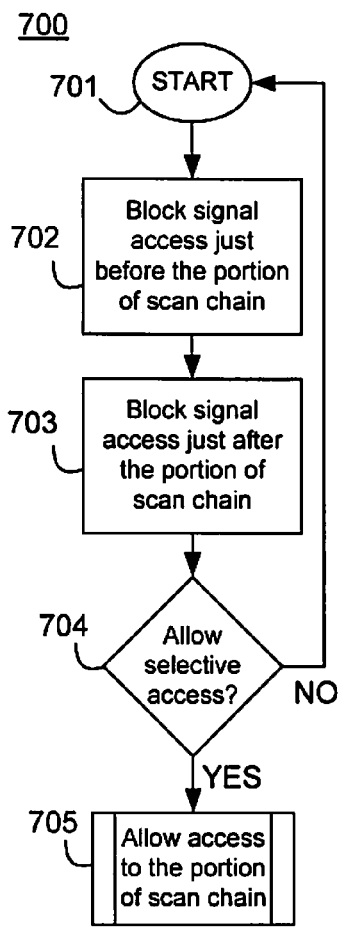
FIG. 9A is a flow diagram of an exemplary method of controlling access to and/or exit from a portion of scan chain.
Figure 9B:
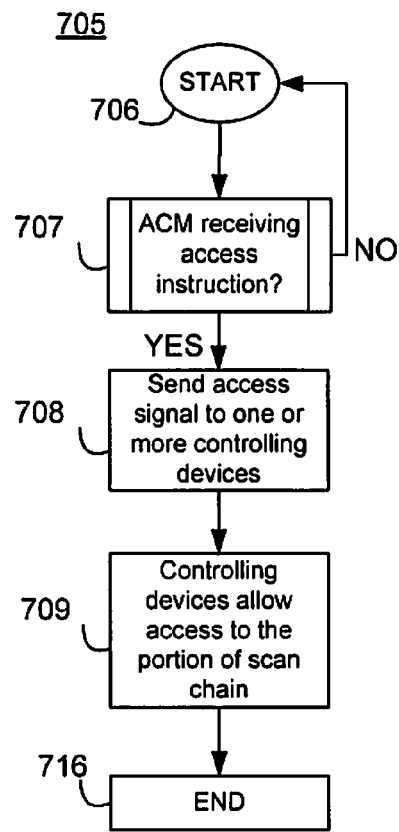
FIG. 9B is a flow diagram of an exemplary method of allowing access to and/or exit from a portion of scan chain.
Figure 9C:
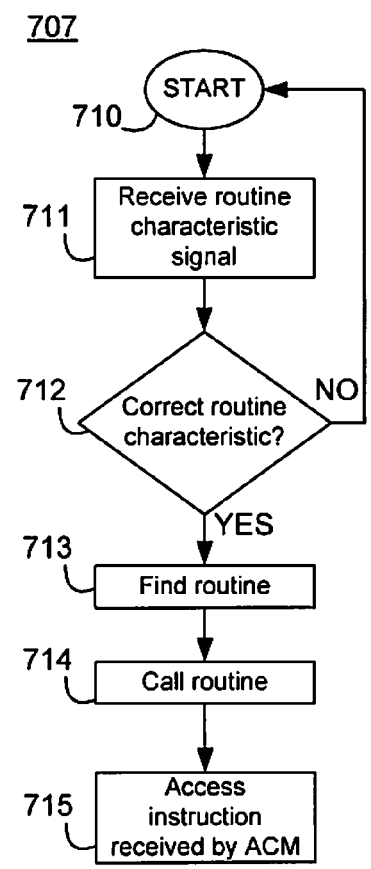
FIG. 9C is a flow diagram of an access control mechanism receiving an access instruction.

FIGS. 9A, 9B, and 9C are flow diagrams of various exemplary embodiments of the invention followed in order to allow signal access to and/or exit from a protected portion of a scan chain. Method 700 starts with start block 701. The next step as shown in method block 702 is to block signal access just before the protected portion of scan chain with a first controlling device. Similarly the next step as shown in method block 703 is to block signal access just after the portion of scan chain with a second controlling device. The next step is described in decision block 704 is to decide whether to allow access to and/or exit from the protected portion. If 'YES' then access to and/or exit from the protected portion of the scan chain is allowed. If 'NO' method 700 begins again at start block 701.

In order to allow access to and/or exit from the protected portion of a scan chain as shown in method block 705, method 705 shown in FIG. 9B is followed. Method 705 starts at start block 706. The next method step as shown in method block 707 is to decide whether the access control mechanism is receiving an access instruction. If 'YES' then the access control mechanism sends an access signal to one or more controlling devices as described in method block 708. If 'No' method 705 begins again at start block 706. The next method step, as shown in method block 709, is for the controlling devices to allow access to the protected portion of the scan chain. Method 705 ends with end block 715.

In order to determine whether the access control mechanism is receiving an access instruction as shown in method block 707 in FIG. 9B, method 707 in FIG. 9C is followed. Method 707 starts at start block 710. The next step as shown in method block 711 is for the access control mechanism to receive a routine characteristic. It is next determined if the routine characteristic is correct in decision block 712. If 'NO' method 707 begins again at start block 710. If 'YES' the access control mechanism then finds and calls the routine, as shown in method block 713 and 714 respectively. Method 707 is completed when access control mechanism receives the access instruction, as shown in method block 715.

FIGS. 10A and 10B are flow diagrams of various exemplary embodiments of the invention describing methods to block access to and/or from a protected portion of a scan chain. In order to block access to and/or exit from the protected portion of a scan chain as shown in method block 805, method 805 shown in FIG. 8B is followed. Method 805 starts at start block 806. The next method step as shown in method block 807 is to decide whether the access control mechanism is receiving an access instruction. If 'YES' then the access control mechanism sends an access signal to one or more controlling devices as described in method block 808. If 'No' method 805 begins again at start block 806. The next method step, as shown in method block 809, is for the controlling devices to allow access to the protected portion of the scan chain. Method 805 ends with end block 815.

In order to determine whether the access control mechanism is receiving an access instruction as shown in method block 807 in FIG. 8B, method 807 in FIG. 8C is followed. Method 807 starts at start block 810. The next step as shown in method block 811 is for the access control mechanism to receive a routine characteristic. It is next determined if the routine characteristic is correct in decision block 812. If 'NO' method 807 begins again at start block 810. If 'YES' the access control mechanism then finds and calls the routine, as shown in method block 813 and 814 respectively. Method 807 is completed when access control mechanism receives the access instruction, as shown in method block 815.

While the foregoing is directed to embodiments of the present invention, other and further embodiments of the invention may be devised without departing from the basic scope thereof, and the scope thereof is determined by the claims that follow.

The invention claimed is:

1. An apparatus for providing controlled access through a portion of a scan chain within a scannable device, the apparatus comprising:
   a first controlling device placed within the scan chain prior to the portion of the scan chain to be controlled;
   a second controlling device placed within the scan chain just after the portion of the scan chain to be controlled, and;
   an access control mechanism coupled to the first controlling device and the second controlling device, wherein the access control mechanism controls access of a scan signal through the portion of the scan chain between the first controlling device and the second controlling device by simultaneously causing said first controlling device to block input of said scan signal into said portion of the scan chain and causing said second controlling device to block output of a signal from said portion of the scan chain, said second controlling device transmitting a bypass scan signal as an output when blocking output of the signal from said portion of the scan chain.

2. The apparatus of claim 1 further comprising:
   a routine containing an access instruction, the access instruction coupled to the access control mechanism wherein when the routine is called, the access instruction directs the access control mechanism to allow access to and/or exit from the portion of the boundary scan.

3. The apparatus of claim 2 wherein the routine is selectively called by an authorized user by identifying a correct routine characteristic.

4. The apparatus of claim 3 wherein the access control mechanism coupled to the first and second controlling devices is a test access port (TAP) controller.

5. The apparatus of claim 4 wherein the TAP controller, having an instruction register contained within, accepts a routine location signal and passes the routine location signal to the instruction register, wherein the instruction register locates and calls the routine.

6. The apparatus of claim 1 wherein the first and second controlling devices are a multiplexer and the access control mechanism coupled to the first and second controlling devices is an e-fuse.

7. The apparatus of claim 1 wherein the access control mechanism coupled to the first and second controlling devices is a test access port (TAP) controller which triggers one or more e-fuses, the e-fuses controlling said first and second controlling devices.

8. The apparatus of claim 7 further comprising:
   a routine containing a triggering instruction, the triggering instruction coupled to the TAP controller when the routine is called, the triggering instruction directs the access control mechanism to trigger the e-fuses at each end of the portion of the boundary scan,
   wherein the TAP controller, having an instruction register contained within, accepts a routine location signal and passes the routine location signal to the instruction register, wherein the instruction register locates and calls the routine.

9. A method for providing controlled access through a portion of a scan chain within a scannable device, the method comprising the steps of:
   blocking boundary scan signal access just before the portion of the scan chain to be controlled;

blocking boundary scan signal exit from said portion of the scan chain just after the portion of the scan chain to be controlled; and selectively controlling scan signal access through the portion of the scan chain to be controlled by simultaneously enabling a first controlling device for blocking boundary scan signal access just before said portion of the scan chain to be controlled and enabling a second controlling device for blocking boundary scan signal exit from said portion of the scan chain to be controlled just after said portion of the scan chain to be controlled, said second controlling device transmitting a by-pass scan signal as an output when blocking boundary scan signal exit from said portion of the scan chain to be controlled.

10. The method of claim 9 wherein, allowing selective access to and/or exit from the portion of the scan chain to be controlled further includes the steps of:

receiving an access instruction from a routine, wherein the access instruction allows access through the portion of the scan chain when the routine is called.

11. The method of claim 10 wherein, receiving an access instruction from a routine is accomplished by a test access port (TAP) controller.

12. The method of claim 11 wherein, selectively controlling scan signal access through the portion of the scan chain to be controlled further includes the steps of:

receiving a routine location signal into the TAP controller, the TAP controller having an instruction register contained within, and;

transferring the routine location signal to the instruction register, wherein the instruction register locates and calls the routine.

13. The method of claim 9 wherein said first controlling device comprises a first multiplexer and said second controlling device comprises a second multiplexer, and selectively controlling scan signal access through the portion of the scan chain to be controlled is accomplished by an e-fuse.

14. The method of claim 9 wherein selectively controlling scan signal access through the portion of the scan chain to be controlled is accomplished by an test access port (TAP) controller which triggers one or more e-fuses, the e-fuses controlling said first and second controlling devices.

15. The method of claim 14 wherein selectively controlling scan signal access through the portion of the scan chain to be controlled is accomplished by the TAP controller comprising the steps of:

receiving a routine location signal containing a triggering instruction transferring the routine location signal to an instruction register coupled to and contained in the TAP controller, wherein the instruction register locates and calls the routine;

triggering an e-fuse circuit not allowing access the portion of the boundary chain to be controlled.

16. A computer readable program for enabling a computer to control access to and/or exit from a portion of a scan chain within a scannable device, the computer readable program stored on a computer readable medium and configured to perform the steps of:

blocking boundary scan signal access just before the portion of the scan chain to be controlled;

blocking boundary scan signal exit from said portion of the scan chain just after the portion of the scan chain to be controlled; and selectively controlling scan signal access through the portion of the scan chain to be controlled by simultaneously enabling a first controlling device for blocking boundary scan signal access just before said portion of the scan chain to be controlled and enabling a second controlling device for blocking boundary scan signal exit from said portion of the scan chain to be controlled just after said portion of the scan chain to be controlled, said second controlling device transmitting a by-pass scan signal as an output when blocking boundary scan signal exit from said portion of the scan chain to be controlled.

17. A computer readable program as in claim 16 wherein selectively controlling scan signal access through the portion of the scan chain to be controlled further comprises the steps of:

receiving an access instruction from a routine when the routine is called.

18. A computer readable program as in claim 17 wherein, selectively controlling scan signal access through the portion of the scan chain to be controlled is fulfilled by a test access port (TAP) controller receiving the access instruction from the routine.

19. A computer readable program as in claim 18 further configured to perform the steps of:

determining the location of the routine;

inputting the location of the routing into the TAP controller, the TAP controller being coupled to an instruction register contained in the TAP controller, wherein the instruction register locates and calls the routine.

* * * * *

UNITED STATES PATENT AND TRADEMARK OFFICE
CERTIFICATE OF CORRECTION

| | | |
|---|---|---|
| PATENT NO. | : 7,620,864 B2 | Page 1 of 1 |
| APPLICATION NO. | : 11/553122 | |
| DATED | : November 17, 2009 | |
| INVENTOR(S) | : John Robert Elliott | |

It is certified that error appears in the above-identified patent and that said Letters Patent is hereby corrected as shown below:

Title Page;
Page 1, Col. 2, Line (74), *Attorney, Agent, or Firm*, please replace "Matthew C. Zebrer" with
-- Matthew C. Zehrer --.

Signed and Sealed this

Sixteenth Day of March, 2010

David J. Kappos
*Director of the United States Patent and Trademark Office*